(12) United States Patent
Cheng et al.

(10) Patent No.: US 9,780,173 B2
(45) Date of Patent: Oct. 3, 2017

(54) HIGH ASPECT RATIO TRAPPING SEMICONDUCTOR WITH UNIFORM HEIGHT AND ISOLATED FROM BULK SUBSTRATE

(71) Applicant: INTERNATIONAL BUSINESS MACHINES CORPORATION, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/992,051

(22) Filed: Jan. 11, 2016

(65) Prior Publication Data
US 2016/0141370 A1   May 19, 2016

Related U.S. Application Data

(62) Division of application No. 14/541,213, filed on Nov. 14, 2014, now Pat. No. 9,293,530.

(51) Int. Cl.
| | |
|---|---|
| *H01L 29/16* | (2006.01) |
| *H01L 29/06* | (2006.01) |
| *H01L 21/762* | (2006.01) |
| *H01L 21/306* | (2006.01) |
| *H01L 21/8234* | (2006.01) |

(Continued)

(52) U.S. Cl.
CPC ........ *H01L 29/16* (2013.01); *H01L 21/30604* (2013.01); *H01L 21/762* (2013.01); *H01L 21/823431* (2013.01); *H01L 21/823481* (2013.01); *H01L 21/84* (2013.01); *H01L 29/0649* (2013.01); *H01L 21/02639* (2013.01)

(58) Field of Classification Search
CPC . H01L 27/0924; H01L 29/16; H01L 29/0649; H01L 21/762; H01L 21/30604; H01L 21/025532; H01L 21/823431
See application file for complete search history.

(56) References Cited

U.S. PATENT DOCUMENTS

| | | |
|---|---|---|
| 6,362,071 B1 | 3/2002 | Nguyen et al. |
| 6,919,258 B2 | 7/2005 | Grant et al. |

(Continued)

OTHER PUBLICATIONS

IBM: List of IBM Patents or Patent Applications Treated as Related (Appendix P), Jan. 12, 2016, 2 pages.

(Continued)

*Primary Examiner* — Tucker J Wright
(74) *Attorney, Agent, or Firm* — L. Jeffrey Kelly

(57) ABSTRACT

A semiconductor structure having an isolated device region separated from channel defects formed during Aspect Ratio Trapping (ART). The structure includes: an isolated device region of a semiconductor channel separated from a defect region of a semiconductor channel by a barrier layer, the isolated device region is free of formation defects, the defect region includes formation defects; a substrate directly below the defect region of the semiconductor channel; and a dielectric layer adjacent to the defect region, below the barrier layer, and above the substrate.

5 Claims, 4 Drawing Sheets

(51) Int. Cl.
*H01L 21/84* (2006.01)
*H01L 21/02* (2006.01)

(56) References Cited

U.S. PATENT DOCUMENTS

| | | |
|---|---|---|
| 7,390,701 B2 | 6/2008 | Cheng et al. |
| 7,799,592 B2 | 9/2010 | Lochtefeld |
| 8,119,494 B1 | 2/2012 | Vellianitis |
| 8,173,551 B2 | 5/2012 | Bai et al. |
| 8,183,667 B2 | 5/2012 | Park |
| 8,274,097 B2 | 9/2012 | Cheng |
| 8,624,326 B2 | 1/2014 | Chen et al. |
| 9,123,627 B1 * | 9/2015 | Qi ........................ H01L 29/165 |

OTHER PUBLICATIONS

Pending U.S. Appl. No. 14/541,213, filed Nov. 14, 2014, entitled: "High Aspect Ratio Trapping Semiconductor With Uniform Height and Isolated From Bulk Substrate", 19 pages.

Park et al., "Defect reduction of selective Ge epitaxy in trenches on Si(001) substrates using aspect ratio trapping", Applied Physics Letters, vol. 90, No. 052113, 2007, American Institute of Physics, pp. 052113-1-052113-3.

Luo et al., "Nearly Dislocation-free Ge/Si Heterostructures by Using Nanoscale Epitaxial Growth Method", 2012 International Conference on Solid State Devices and Materials Science, Physics Procedia, vol. 25, 2012, pp. 105-109.

Van Dal et al., "Germanium p-Channel FinFET Fabricated by Aspect Ratio Trapping", IEEE Transactions on Electron Devices, vol. 61, No. 2, Feb. 2014, pp. 430-436.

* cited by examiner

HIGH ASPECT RATIO TRAPPING SEMICONDUCTOR WITH UNIFORM HEIGHT AND ISOLATED FROM BULK SUBSTRATE

CROSS-REFERENCE

The present application is a divisional of, and claims priority under 35 U.S.C. §120, U.S. patent application Ser. No. 14/541,213, filed on Nov. 14, 2014, which is incorporated by reference in its entirety.

BACKGROUND

The present invention generally relates to semiconductor device manufacturing, and more particularly to a semiconductor device having a height-controlled channel isolated from a defective channel region.

The preparation of epitaxial layers on various substrates is an important field in modern materials science and technology. Such films are applied for example in protective coatings, thin film devices, semiconducting devices, laser diodes, sensors, for data storage devices, and for mounting organic, including biological layers onto suitable substrates. The term "epitaxial" means the ordered growth of a material on the surface of a substrate or another layer, such that the crystalline properties and orientation of the deposited material reflects the orientation and crystalline structure of the substrate. Thus epitaxial deposition processes provide means to form thin specifically oriented crystalline layers.

A problem in epitaxial deposition is one of lattice mismatch or misfit. Lattice mismatch occurs when the epitaxy layer and the seed layer have different lattice constants. Deviations of less than 1 percent readily result in structural defects, including various types of dislocation, and the built-up strain in the epitaxy layer.

SUMMARY

According to an embodiment of the present invention, a structure is provided. The structure may include an isolated device region of a semiconductor channel separated from a defect region of a semiconductor channel by a barrier layer, the isolated device region is free of formation defects, the defect region includes formation defects; a substrate directly below the defect region of the semiconductor channel; and a dielectric layer adjacent to the defect region, below the barrier layer, and above the substrate.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
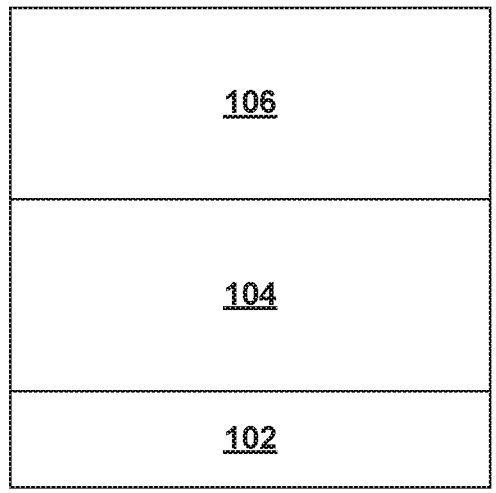
FIG. 1 is a cross section view of a semiconductor structure, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to the fabrication of a height-controlled semiconductor channel isolated from a defective channel portion. Ideally, it may be desirable to epitaxially grow a semiconductor channel on a substrate in a deep trench, trapping defects in a lower region and allowing for a defect free top portion of the semiconductor channel. The purpose of this invention is to form a semiconductor channel and isolating a defect-free region from a defect region of the semiconductor channel, while allowing for a controlled height of the defect-free region.

One way to form an isolated defect-free region is to grow a semiconductor channel in a deep trench in a first dielectric and a second dielectric, removing the second dielectric, form a spacer layer on a top portion of the semiconductor channel, recess the first dielectric, form an undercut trench to separate a defect-free region (top portion) from a defect region (bottom portion), and form a barrier layer between the defect-free region and the defect region. One embodiment by which to form an isolated defect-free device region is described in detail below with reference to the accompanying drawings FIGS. 1-8.

It should be noted, the illustrated embodiment shows a fin for a device, such as a fin field-effect-transistor (finFET). However, this invention may be applicable to other structures, such as, for example, a nanowire device.

Referring now to FIG. 1, a structure 100 is illustrated during an intermediate step of a method of fabricating an isolated semiconductor channel. More specifically, the method can start with forming a first dielectric layer 104 and a second dielectric 106 on a substrate 102.

The substrate 102 may include; a bulk semiconductor, a layered semiconductor substrate such as Si/SiGe, a silicon-on-insulator substrate (SOI), or a SiGe-on-insulator substrate (SGOI). The substrate 102 may include any semiconducting material, such as, for example, undoped Si, n-doped Si, p-doped Si, single crystal Si, polycrystalline Si, amorphous Si, Ge, SiGe, SiC, SiGeC, Ga, GaAs, InAs, InP, or any other III/V or II/VI compound semiconductors. In an embodiment, the substrate 102 is a bulk silicon substrate.

The first dielectric layer 104 may be formed on the substrate 102 using any deposition technique known in the art, such as, for example, chemical vapor deposition (CVD), plasma enhanced chemical vapor deposition (PECVD), atomic layer deposition (ALD), or physical vapor deposition (PVD). The first dielectric layer 104 may be any dielectric material known in the art, such as, for example, oxides, nitrides, or oxynitrides. The first dielectric layer 104 may have a thickness ranging from about 10 nm to about 200 nm. In an embodiment, the first dielectric layer 104 is an oxide (e.g., $SiO_2$).

The second dielectric 106 may be formed on the first dielectric layer 104 using any deposition technique known in the art, such as, for example, chemical vapor deposition (CVD), plasma enhanced chemical vapor deposition (PECVD), atomic layer deposition (ALD), or physical vapor deposition (PVD). The second dielectric 106 may be any dielectric material known in the art, such as, for example, oxides, nitrides, or oxynitrides. The second dielectric 106 may have different etch properties from the first dielectric layer 104 (i.e., the first dielectric layer 104 may be etch selective to the second dielectric 106, and vice versa). The second dielectric 106 may have a thickness ranging from about 10 nm to about 200 nm. In an embodiment, the second dielectric 106 is a nitride (e.g., $Si_3N_4$).

Figure 2:
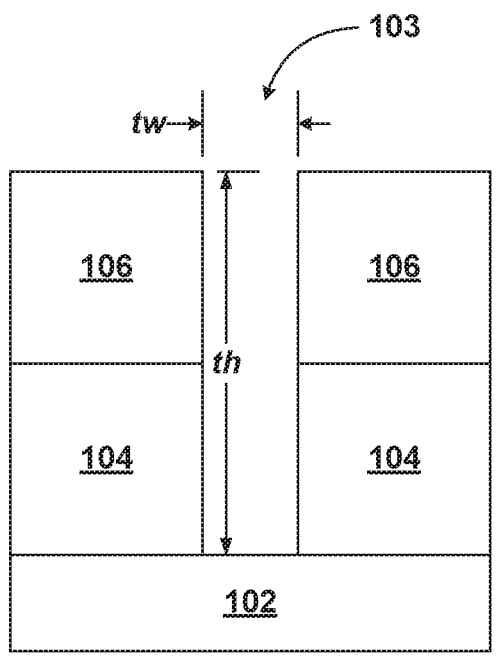
FIG. 2 is a cross section view of the semiconductor structure and illustrates the formation of a first trench in a second dielectric and a first dielectric.

Referring now to FIG. 2, a structure 100 is illustrated during an intermediate step of a method of fabricating an isolated semiconductor channel. More specifically, the method can include forming a first trench 103 in the first dielectric layer 104 and the second dielectric 106.

The first trench 103 may be formed through the first dielectric layer 104 and through the second dielectric 106 using any etching technique known in the art, such as, for example, photolithography and/or reactive ion etching (RIE). The first trench 103 may be etched through the second dielectric 106 selective to the first dielectric layer 104 (i.e., etching the second dielectric 106 and using the first dielectric layer 104 as an etch stop). Then the first dielectric layer 104 may be etched selective to the substrate 102 (i.e., etching the first dielectric layer 104 using the substrate 102 as an etch stop).

The first trench 103 may have a trench width (tw) and trench height (th). The first trench 103 may be formed in such a way to allow for aspect ratio trapping (ART) of subsequently grown semiconductors. The ART process may utilize deep trenches to epitaxially grow semiconductor materials, such as, for example III/V group materials, where the semiconductor has a different lattice structure than the seed layer. The lattice mismatch generally causes misfit dislocations (i.e., defects). The dislocations in a mismatched cubic semiconductor grown on a Si {100} surface in the near vicinity of a trench sidewall and bend toward the trench sidewall at approximately 30 degrees through 60 degrees. For example the dislocations may be about 500 nm from sidewalls of the first dielectric layer 104, such that {111} dislocations may bend toward the trench sidewall at approximately a 54.7° angle from a top surface of the substrate 102. Based on this relationship, a predetermined vertical distance may be necessary to trap defects, where the predetermined vertical distance may be between about half of the trench width (tw) to about double the trench width (tw). The predetermined vertical distance may be less than the thickness of the first dielectric layer 104. In an embodiment, the trench width (tw) is about 10 nm and the trench height (th) is about 100 nm. In such an embodiment, the thickness of the first dielectric 104 may be greater than 20 nm, wherein any subsequent defects may be present below a top surface of the first dielectric 104.

Figure 3:
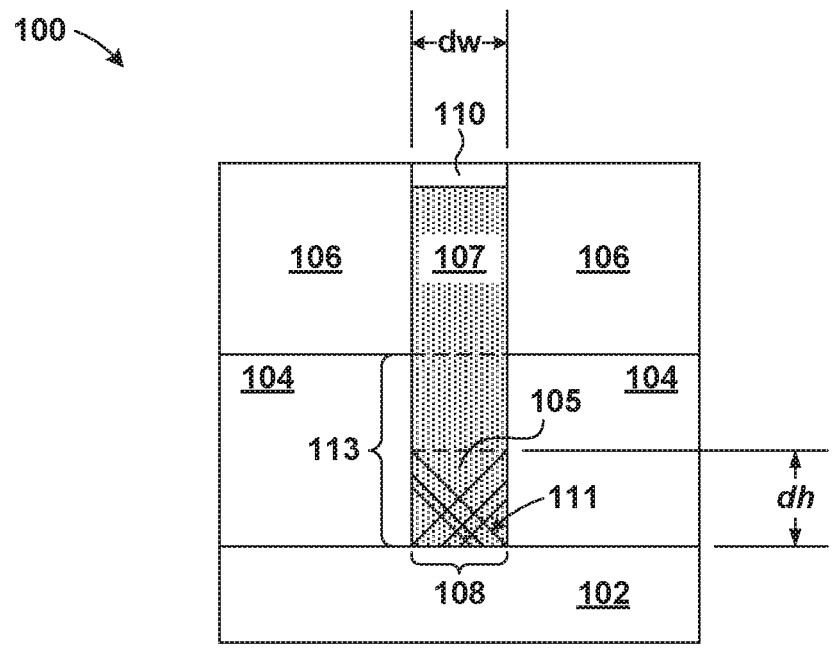
FIG. 3 is a cross section view of the semiconductor structure and illustrates the formation of a semiconductor channel in the first trench.

Referring now to FIG. 3, a structure 100 is illustrated during an intermediate step of a method of fabricating an isolated semiconductor channel. More specifically, the method can include forming a semiconductor channel 108.

The semiconductor channel 108 may be formed in the first trench 103 by selective epitaxial growth using any epitaxial deposition system, such as, but not limited to, metal-organic chemical vapor deposition (MOCVD), atmospheric-pressure CVD (APCVD), low- (or reduced-) pressure CVD (LPCVD), ultra-high-vacuum CVD (UHCVD), molecular beam epitaxy (MBE), or atomic layer deposition (ALD). In the CVD process, selective epitaxial growth may typically include introducing a source gas into the chamber. The source gas may include at least one precursor gas and a carrier gas, such as, for example, hydrogen. A reactor chamber may be heated by, for example, RF-heating. A growth temperature in the chamber may range from about 300° C. to about 900° C., depending on the composition of the crystalline material. The growth system may also utilize low-energy plasma to enhance the layer growth kinetics. The semiconductor channel 108 may be any semiconductor material known in the art, such as, for example, Si, Ge, SiGe, SiC, SiGeC, Ga, GaAs, InAs, InP, or any other III/V, II/VI or IV compound semiconductors. In an embodiment, the semiconductor channel 108 is Ge epitaxially grown directly on the substrate 102, where the substrate 102 is a bulk silicon substrate. The semiconductor channel 108 may be polished to a top surface of the second dielectric 106 and then recessed below the top surface of the second dielectric 106. A cap 110 may be formed on the semiconductor channel 108 and polished to the top surface of the second dielectric 106, such that the semiconductor channel 108 and the cap 110 have a height roughly equal to the sum of the thickness of the first dielectric layer 104 and the thickness of the second dielectric 106. The semiconductor channel 108 may have a device width (dw) substantially similar to the trench width (tw).

The semiconductor channel 108 may include a first region 113 and a second region 107. The first region 113 may include a defect region 105. The defect region 105 may have a defect height (dh) in the range of the predetermined vertical distance, as discussed above, and may include dislocation defects 111. The defect region 105 may have a height extending from a bottom surface of the first region 113 a distance less than a height of the first region 113, alternatively, the defect region 105 may extend from the bottom surface of the first region 113 to a top surface of the first region 113. The second region 107 may be a defect free region, where any dislocations or defects present in the semiconductor channel 108 are below the second region 107. The second region 107 may extend from the bottom surface of the second dielectric 106 to a bottom surface of the cap 110. It should be noted, the second region 107 may also be referred to as device region.

The dislocation defects 111 in the semiconductor channel 108 may reach and terminate at the sidewalls of the first dielectric layer 104. The dislocation defects 111 may decrease in density with increasing distance from a bottom surface of the semiconductor channel 108 (i.e., the top surface of the seed layer). Accordingly, the second region 107 may be substantially exhausted of dislocation defects 111. Various dislocation defects 111, such as threading dislocations, stacking faults, twin boundaries, or anti-phase boundaries may be substantially eliminated from the second region 107 of the semiconductor channel 108.

Figure 4:
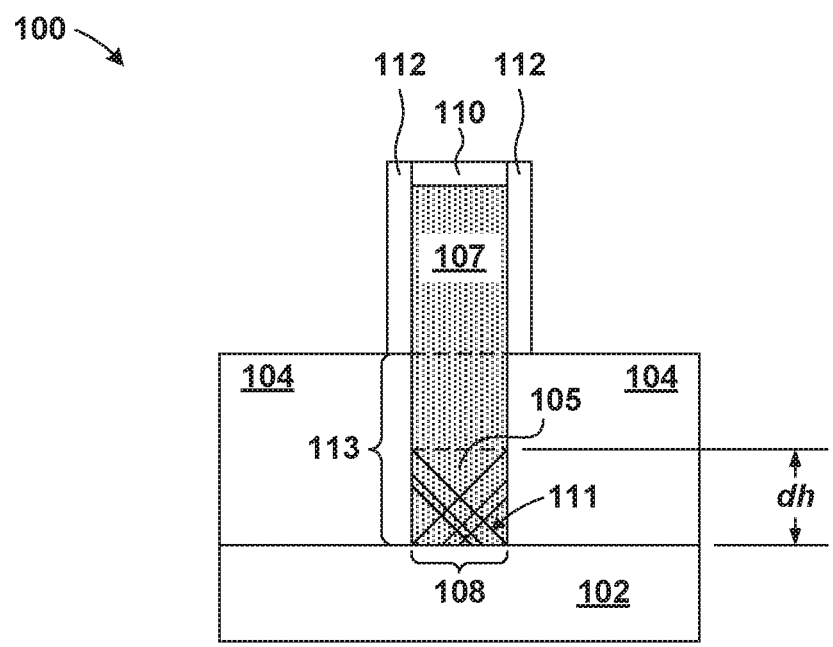
FIG. 4 is a cross section view of the semiconductor structure and illustrates the removal of the second dielectric.

Referring now to FIG. 4, a structure 100 is illustrated during an intermediate step of a method of fabricating an isolated semiconductor channel. More specifically, the method can include removing the second dielectric 106 and forming a spacer 112.

The second dielectric 106 may be removed using any removal technique known in the art, such as, for example, RIE selective to the first dielectric layer 104 and the cap 110 (i.e., etching the second dielectric 106, using the cap 110 as a mask and the first dielectric layer 104 as an etch stop). The second region 107 may be exposed at sidewalls of the second region 107.

The spacer 112 may be formed on the exposed portion of the second region 107 using any spacer formation technique known in the art, such as, for example, conformally depositing a spacer layer on a structure and removing the spacer layer from horizontal surfaces using a directional etch. The spacer 112 may have a thickness of about 4 nm to about 20 nm.

Figure 5:
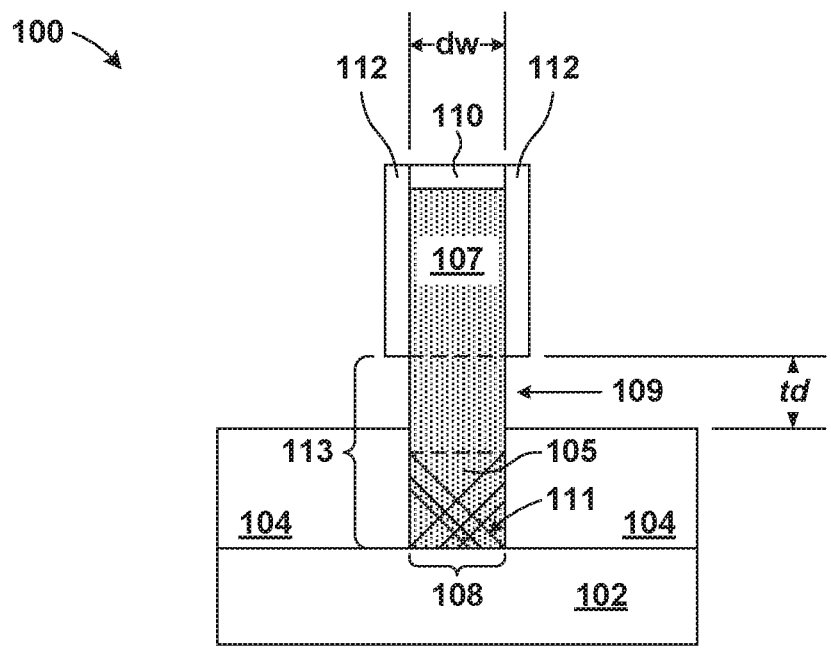
FIG. 5 is a cross section view of the semiconductor structure and illustrates the recessing of the first dielectric.

Referring now to FIG. 5, a structure 100 is illustrated during an intermediate step of a method of fabricating an isolated semiconductor channel. More specifically, the method can include removing a top portion of the first dielectric layer 104 (i.e., recessing the first dielectric layer 104) exposing a trenching region 109 of the first region 113.

The first dielectric layer 104 may be recessed using any etching technique known in the art, such as, for example, RIE selective to the cap 110 and the spacer 112 (i.e., etching the top portion the first dielectric layer 104 using the cap 110 and the spacer 112 as a mask). The first dielectric layer 104 may be recessed a trench distance (td), where the trench distance (td) is about 10 nm. The trenching region 109 may be a region of the first region 113. The trench region 109 may include a portion of the defect region 105, alternatively, the trench region 109 may not include a portion of the defect region 105 as illustrated.

Figure 6:
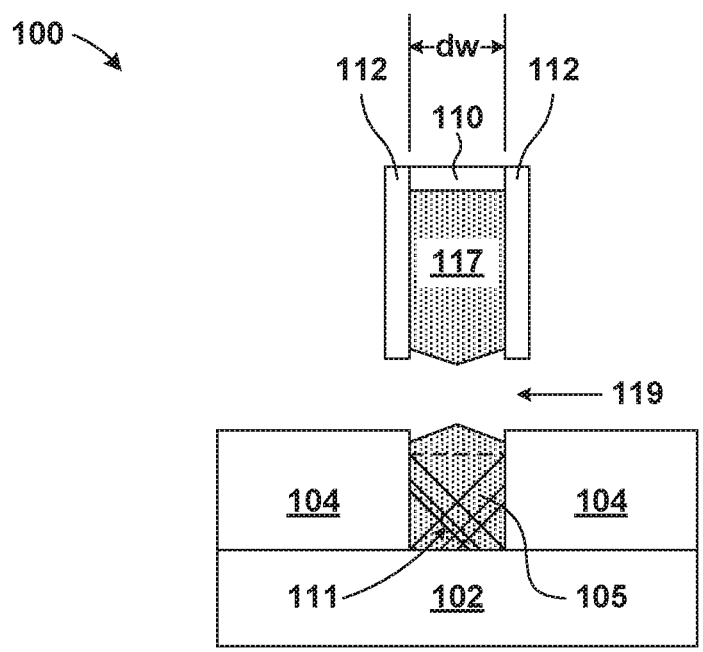
FIG. 6 is a cross section view of the semiconductor structure and illustrates the formation of an undercut trench in the semiconductor channel.

Referring now to FIG. 6, a structure 100 is illustrated during an intermediate step of a method of fabricating an isolated semiconductor channel. More specifically, the method can include forming an undercut trench 119 through the trench region 109.

The second region 107 may be anchored to the structure 100 on lateral sides of a base structure (not illustrated). The undercut trench 119 may be formed using any known isotropic or lateral etching technique know in the art, such as, for example, a wet etch. In an embodiment, the device region 107 may have a device width (dw) equal to about 10 nm, such that an isotropic etch of 7 nm per side may be sufficient to completely undercut the device region 107 with minimal process variation. An isolated region 117 may be the portion of the second region 107 that is separated from the first region 113 and the defect region 105. The undercut trench 119 may separate the isolated region 117 from the defect region 105, such that the isolated region 117 is detached from dislocation defects 111 of the defect regions 105. It should be noted, the isolated region 117 may also be referred to as an isolated device region.

Figure 7:
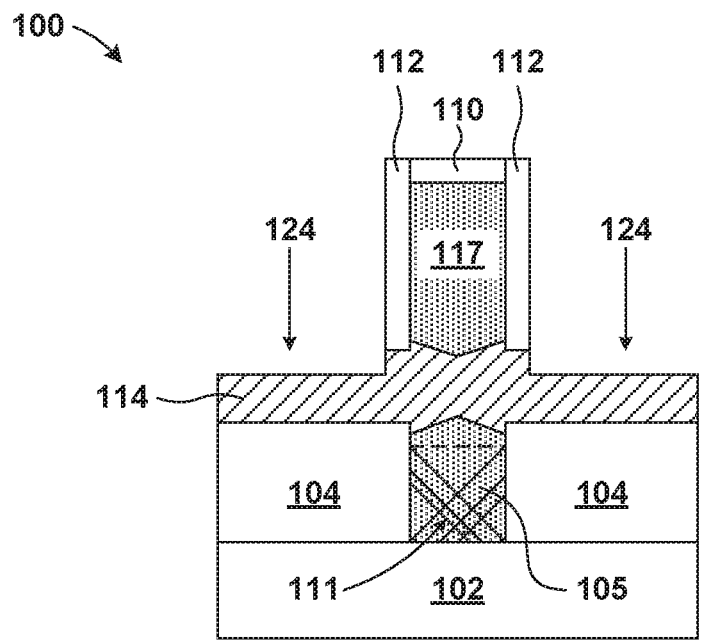
FIG. 7 is a cross section view of the semiconductor structure and illustrates the formation of a barrier layer on the recessed first dielectric and in the undercut trench.
Figure 8:
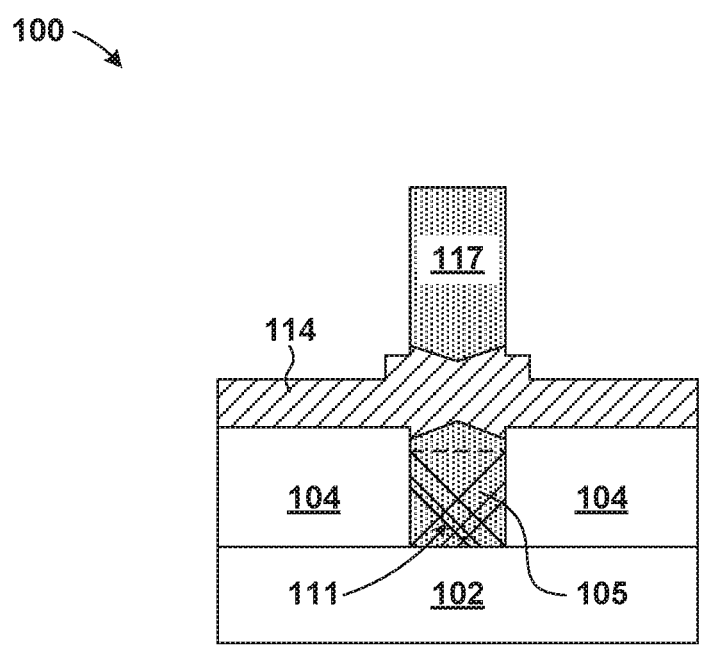
FIG. 8 is a cross section view of the semiconductor structure and illustrates the removal of a spacer and cap from the semiconductor channel.

Referring now to FIGS. 7 and 8, a structure 100 is illustrated during an intermediate step of a method of fabricating an isolated semiconductor channel. More specifically, the method can include forming a barrier layer 114 on the first dielectric layer 104 and in the undercut trench 119.

The barrier layer 114 may be formed on the first dielectric layer 104 and in the undercut trench 119 using any horizontal filling deposition technique known in the art, such as, for example, spin deposition of a liquid material while spinning the wafer at high RPM's, followed by a curing period and annealing at roughly 500° C. The barrier layer 114 may include any isolation material known in the art, such as, for example, oxides, nitrides, or oxynitrides. In an embodiment, the barrier layer 114 is a flowable oxide. The barrier layer 114 may provide electrical insulation between the defect region 105 and the isolated region 117. The barrier layer 114 may have an exposed portion 124 above the first dielectric layer 104 and an isolation portion between the defect region 105 and the isolated device region 117. The barrier layer 114 may be recessed at the exposed portion 124. The exposed portion 124 may be recessed using any etching technique known in the art, such as, for example, a wet etch process. It should be noted, the height of the isolated device region 117 (e.g., a fin) may be well controlled by the deposition (i.e., thickness) of the second dielectric 106.

The cap 110 and the spacer 112 may be removed from the isolated region 117 exposing a top surface and side surfaces of the isolated region 117. The isolated region 117 may be subsequently used to form other components (e.g., a fin for a finFET). In an embodiment, the isolated region 117 is a fin and subsequent metal gates may be procured to form a finFET device. The finFET device may utilize the epitaxial growth of a heterogeneous channel while isolating a fin region from a defect region of the heterogeneous channel. This method and structure may increase efficiency and allow for a well-controlled fin height.

It should be noted, the ART process may be a viable approach to epitaxially grow heterostructure semiconductors. One of the issues for the ART process is that the semiconductor channel has a defective bottom portion (e.g., the defect region 105) causing potential leakage. Additionally, the channel height may be hard to control. In this invention, a method of forming a defect-free region of a semiconductor channel isolated from a defect region, is provided. The thickness of the defect-free region may be easily controlled because it dependants on the thickness of the second dielectric region 106.

It should be noted, the illustrated embodiment shows a fin for a device, such as, for example, a finFET. However, this invention may be applicable to other structures, such as, for example, a nanowire. Additionally, a substrate and channel materials are described in an embodiment as Si and Ge, but may apply to other combinations of materials, such as, for example, III/V, II/V, SiGe, or other combinations.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
    an isolated device region of a semiconductor channel separated from a defect region of a semiconductor channel by a barrier layer, the isolated device region is free of formation defects, the defect region includes formation defects, wherein the barrier layer is a flowable oxide;
    a substrate directly below the defect region of the semiconductor channel; and
    a dielectric layer adjacent to the defect region, below the barrier layer, and above the substrate.

2. The structure of claim 1, wherein the isolated device region has a uniform height.

3. The structure of claim 1, wherein the substrate is a bulk silicon substrate.

4. The structure of claim 1, wherein the semiconductor channel is germanium.

5. The structure of claim 1, wherein the isolated device region is free of misfit dislocations.

* * * * *